(12) United States Patent
Lee et al.

(10) Patent No.: US 9,553,116 B2
(45) Date of Patent: Jan. 24, 2017

(54) IMAGING DETECTOR HAVING AN INTEGRATED WIDE BANDGAP LAYER AND METHOD OF MANUFACTURING THEREOF

(71) Applicant: Teledyne Scientific & Imaging, LLC, Thousand Oaks, CA (US)

(72) Inventors: Donald L. Lee, Thousand Oaks, CA (US); Eric Piquette, Camarillo, CA (US); Majid Zandian, Calabasas, CA (US); Paul H. Kobrin, Newbury Park, CA (US); Haluk Sankur, Ventura, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 14/726,969

(22) Filed: Jun. 1, 2015

(65) Prior Publication Data

US 2015/0357367 A1    Dec. 10, 2015

Related U.S. Application Data

(60) Provisional application No. 62/008,106, filed on Jun. 5, 2014.

(51) Int. Cl.
*H01L 27/146* (2006.01)

(52) U.S. Cl.
CPC ....... *H01L 27/1462* (2013.01); *H01L 27/1464* (2013.01); *H01L 27/1467* (2013.01);
(Continued)

(58) Field of Classification Search
None
See application file for complete search history.

(56) References Cited

U.S. PATENT DOCUMENTS 5,070,241 A  * 12/1991  Jack .................. G01J 5/10
                                                 250/336.1
5,306,386 A  *  4/1994  de Lyon ............. C30B 23/02
                                                 117/105
(Continued)

FOREIGN PATENT DOCUMENTS

EP           0950264      10/1999
WO        WO 98/20561      5/1998

*Primary Examiner* — David E Graybill
(74) *Attorney, Agent, or Firm* — Snell & Wilmer LLP

(57) ABSTRACT

A substrate-removed, surface passivated, and anti-reflective (AR) coated detector assembly is provided. The assembly has an AR coating or passivation layer which includes a wide bandgap thin-film dielectric/passivation layer integrated therein. The wide bandgap thin-film dielectric/passivation layer is positioned proximal to a back interface of a substrate-removed detector assembly. A method of manufacturing the detector assembly includes etching a backside of a partially-removed-substrate detector assembly to obtain an etched detector assembly removed from a substrate. A wide bandgap layer is deposited, in a vacuum chamber, on the etched detector assembly without utilizing an adhesive layer. Additional anti-reflective coating layers are deposited, in the same vacuum chamber, on the wide bandgap layer to form an anti-reflective coating layer with the wide bandgap layer integrated therein. The wide bandgap layer is positioned proximal to an interface portion between the anti-reflective coating layer and the detector assembly.

11 Claims, 4 Drawing Sheets

(52) U.S. Cl.
CPC .. *H01L 27/14665* (2013.01); *H01L 27/14685* (2013.01); *H01L 27/14694* (2013.01); *H01L 27/14696* (2013.01)

(56) References Cited

U.S. PATENT DOCUMENTS

| | | | | |
|---|---|---|---|---|
| 5,536,680 | A | * | 7/1996 | Ehmke ................ H01L 21/6835 257/E21.515 |
| 5,567,975 | A | * | 10/1996 | Walsh ................ H01L 27/1465 257/440 |
| 5,742,089 | A | * | 4/1998 | Rajavel ............... H01L 31/1032 257/442 |
| 5,804,463 | A | * | 9/1998 | Tregilgas ............ H01L 31/1832 438/455 |
| 6,025,585 | A | | 2/2000 | Holland |
| 7,276,749 | B2 | | 10/2007 | Martin et al. |
| 7,295,592 | B2 | | 11/2007 | Hiramatsu et al. |
| 7,436,038 | B2 | | 10/2008 | Engelmann et al. |
| 7,901,870 | B1 | | 3/2011 | Wach |
| 7,965,949 | B1 | | 6/2011 | Wach |
| 8,900,907 | B2 | * | 12/2014 | Pautet ................ H01L 27/1465 257/E31.004 |
| 2005/0104089 | A1 | | 5/2005 | Engelmann et al. |
| 2005/0226636 | A1 | | 10/2005 | Hiramatsu et al. |
| 2006/0267054 | A1 | | 11/2006 | Martin et al. |
| 2013/0005068 | A1 | * | 1/2013 | Pautet ................ H01L 27/1465 438/57 |
| 2015/0083892 | A1 | * | 3/2015 | Cooper ............. H01L 27/14618 250/208.1 |

* cited by examiner

IMAGING DETECTOR HAVING AN INTEGRATED WIDE BANDGAP LAYER AND METHOD OF MANUFACTURING THEREOF

CLAIM OF PRIORITY AND INCORPORATION BY REFERENCE

This application claims the benefit and priority of U.S. Provisional Application No. 62/008,106 entitled "IMAGING DETECTOR HAVING AN INTEGRATED WIDE BANDGAP LAYER AND METHOD OF MANUFACTURING THEREOF," filed on Jun. 5, 2014, the entire disclosure of which is hereby incorporated by reference herein.

BACKGROUND

Field

The present disclosure relates to image sensors having an anti-reflective/passivation layer and methods of manufacturing thereof.

Description of the Related Art

For applications involving imaging sensors and photo detectors, it is desirable to detect near-UV (near-ultraviolet) and visible as well as infrared wavelength radiation. The detectors may incorporate photodiodes and may be made of, for example, HgCdTe (mercury cadmium telluride, also referred to as MerCadTel or MCT). The detector may be, for example, a hybrid detector that incorporates infrared detector layers for detection of light and collection of photo charge into pixels and a silicon readout integrated circuit (ROIC) for converting the photo charge to voltage with an amplifier for each pixel. The ROIC may multiplex the signals from each pixel to off-chip electronics. An anti-reflective (AR) coating can be applied to reduce or prevent reflection of incident light, thereby increasing the quantum efficiency (QE).

FIG. 1A is an energy band diagram showing a prior art AR coating-detector assembly 100a having an AR coating layer 102a and a dielectric/passivation layer 104a being proximal to the back interface 126a. The dielectric/passivation layer 104a has a relatively narrow bandgap. It is desirable that when a photon with energy greater than the bandgap is absorbed, an electron be excited from the valence band and placed into the conduction band such that the photo charge generated in the valence band can be collected into pixels and measured. In order to achieve high QE on substrate-removed HgCdTe p/n photodiodes, a backside AR-coating layer 102a is applied to match the refractive index of HgCdTe to air/vacuum. The AR-coating layer 102a is formed by depositing transparent dielectric films onto the back n-type surface of the HgCdTe detector 130a. The AR-coating layer 102a can be deposited by, for example, evaporation or sputtering. When short-wavelength UV or visible radiation 120a is absorbed by the n-type HgCdTe (116a), energetic electrons are generated due to the incident radiation having energy significantly greater than the bandgap of HgCdTe. The excess kinetic energy of these electrons (e.g., electron 106a) that are generated in proximity to the back interface 126a allows them to be injected into the dielectric/passivation layer 104a or the portion of the AR-coating layer proximal to the back interface 126a, causing the dielectric/passivation layer 104a and/or the AR coating layer 102a to become negatively charged, as indicated by negative charging 128a. The charging can become progressively greater with increasing exposure duration.

The negative charging 128a in the portion of the AR-coating layer 102a that is most proximal to the back interface 126a and/or dielectric/passivation layer 104a pushes the majority carriers (e.g., electrons) away from the back interface 126a and attracts minority carriers (holes) (shown at energy level 122a), resulting in an inversion/depletion layer 108a. The bandgap is bent as shown in the shaded region 114a (which is positioned adjacent to the N—HgCdTe absorber layer 116a). The inversion/depletion layer or region 108a acts as a potential well that captures photo-generated holes 110a created when short-wavelength radiation is strongly absorbed at the back interface 126a. At cryogenic operating temperatures, the holes 110a do not have adequate thermal energy to surmount the barrier created by the potential well, preventing them from diffusing or drifting towards the front-side p-junction and P—HgCdTe 118a. As a result, short wavelength QE is reduced. The effect is most detrimental in the short wavelength since this radiation is absorbed and photo carriers are generated primarily within the extent of the backside potential well.

SUMMARY

An aspect of the present invention relates to a method of manufacturing a substrate-removed, surface passivated, and anti-reflective coated detector assembly. A substrate-detector assembly is provided. The substrate-detector assembly has an imaging detector connected to a substrate. A part of the substrate is removed to obtain a partially-removed-substrate detector assembly. A backside of the partially-removed-substrate detector assembly is etched to obtain an imaging detector assembly removed from the substrate. A wide bandgap layer is deposited on the imaging detector assembly in a vacuum chamber using for example electron beam evaporation. An anti-reflective coating layer is deposited, in the same (or another) vacuum chamber, on the wide bandgap layer such that the wide bandgap layer is integrated with the anti-reflective coating layer and positioned proximal to an interface portion between the anti-reflective coating layer and the imaging detector assembly.

The deposited wide bandgap layer may be a transparent material with a wide bandgap that is greater than 3 electron volts (eV). For example, the deposited wide bandgap layer may be made of at least one of Y2O3 (Yttrium oxide), MgF2 (Magnesium fluoride) or CaF2 (Calcium fluoride). The wide bandgap layer is a thin-film layer which may have a thickness that is greater than 100 Angstroms and less than 9000 Angstroms. The wide bandgap layer can act as an optically functional first layer of the anti-reflective coating. In an embodiment, the anti-reflective coating layer includes a stack of anti-reflective coating sublayers integrated with the wide bandgap thin-film layer. The imaging detector assembly can be baked or heated to remove residuals. Compounds other than the preferred compounds of Y2O3, MgF2, or CaF2 may also be utilized.

According to another aspect of the present invention, an imaging detector assembly includes an imaging detector that is removed from a substrate for generating a photo charge upon incidence of light. A readout integrated circuit connected to a first side of the imaging detector. The readout integrated circuit converts the photo charge to a current or voltage signal. The imaging detector assembly further includes a passivation anti-reflective coating layer having a wide band-gap layer formed as an integral part of the anti-reflective coating layer. The wide band-gap layer is proximal to the second side of the imaging detector. The wide band-gap layer has a conduction band at a first energy level greater than a second energy level of photo-generated hot electrons, for preventing formation of an inversion region proximal to an interface portion between the imaging detector and the passivation anti-reflective coating layer.

According to yet another aspect of the present invention, an imaging detector assembly is provided. An anti-reflective layer has a first side and a second side. The first side is configured to receive at least one of near ultraviolet radiation, visible radiation, or infrared radiation. A thin-film wide band-gap layer is integrated as a part of the anti-reflective layer. The thin-film wide band-gap layer has a first side and a second side. The first side is connected to the second side of the anti-reflective layer. The thin-film wide band-gap layer has a thickness that is greater than 100 Angstroms and less than 9,000 Angstroms and a bandgap that is greater than 3 electron volts (eV). The imaging detector assembly includes an imaging detector made of HgCdTe (mercury cadmium telluride) that is removed from a substrate. The imaging detector has a first side and a second side, the first side being connected to the second side of the thin-film wide band-gap layer. The imaging detector is configured to generate a photo charge upon incidence of the near ultraviolet radiation, visible radiation, or infrared radiation. A readout integrated circuit is connected to the first side of the imaging detector for converting the photo charge to a current or voltage signal. The thin-film wide band-gap layer has a conduction band at a first energy level greater than a second energy level of photo-generated hot electrons, for preventing formation of an inversion region proximal to an interface portion between the substrate-removed imaging detector and the passivation or anti-reflective coating layer.

BRIEF DESCRIPTION OF THE DRAWINGS

Other systems, methods, features, and advantages of the present disclosure will be or will become apparent to one skilled in the art upon examination of the following figures and detailed description. It is intended that all such additional systems, methods, features, and advantages be included within this description, be within the scope of the present disclosure, and be protected by the accompanying claims. Component parts shown in the drawings are not necessarily to scale, and may be exaggerated to better illustrate the important features of the present disclosure. The first digit of each reference number generally indicates the figure in which the element first appears. In the drawings, like reference numerals designate like parts throughout the different views, wherein:

DETAILED DESCRIPTION

Apparatus, systems and methods that implement the implementation of the various features of the present disclosure will now be described with reference to the drawings. The drawings and the associated descriptions are provided to illustrate some implementations of the present disclosure and not to limit the scope of the present disclosure. Throughout the drawings, reference numbers are re-used to indicate correspondence between reference elements. In addition, the first digit of each reference number generally indicates the figure in which the element first appears.

Figure 1A:
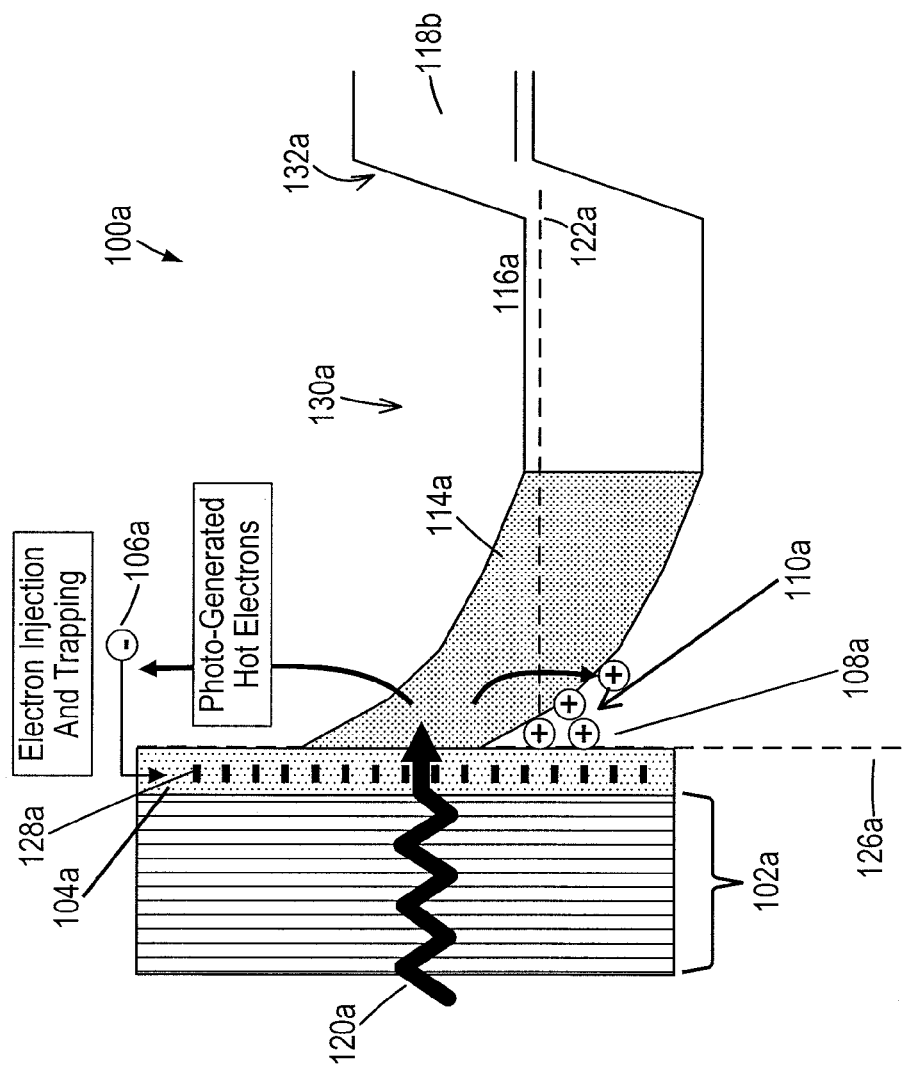
FIG. 1A is an energy band diagram showing a prior art detector assembly having an anti-reflective coating layer and a separate dielectric/passivation portion being proximal to a back interface.
Figure 1B:
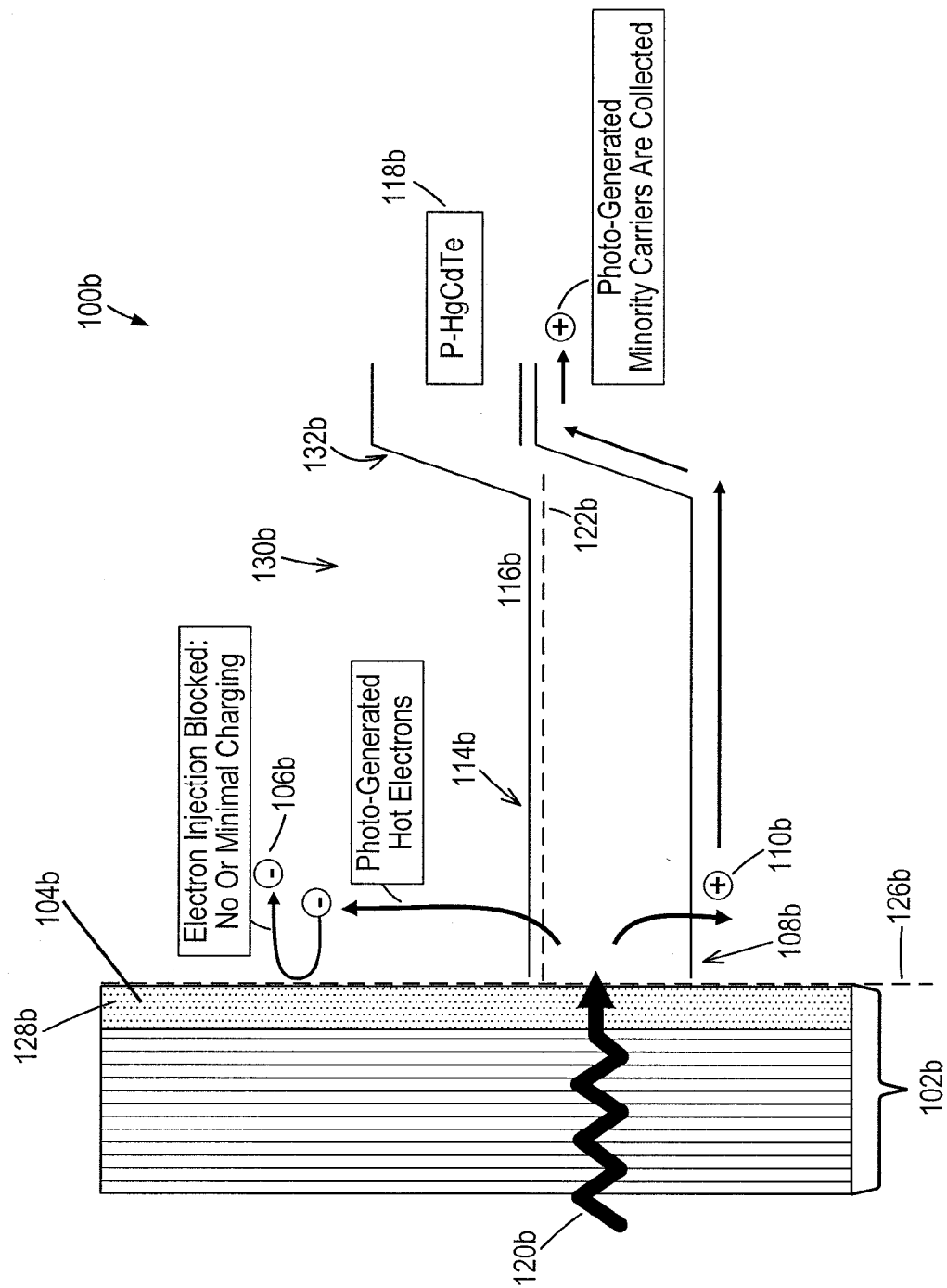
FIG. 1B is an energy band diagram showing a detector assembly having an anti-reflective or passivation coating layer that has a wide bandgap thin-film dielectric/passivation layer integrated therein according to an embodiment of the present invention.

FIG. 1B shows an anti-reflective (AR) coating-detector assembly 100b having an AR coating or passivation layer 102b that has a wide bandgap thin-film dielectric layer 104b integrated therein and positioned proximal to the back interface 126b of the substrate-removed HgCdTe according to an embodiment of the present invention. Although a substrate-removed detector made of HgCdTe is discussed herein, it can be appreciated that substrate-removed detectors made of other materials such as III-V arsenides or antimonides can be utilized without limiting the scope of the present invention. The wide bandgap thin-film dielectric layer 104b may also serve as a passivation layer. The removed substrate may be made of CdZnTe (Cadmium zinc telluride). To illustrate the advantages over the prior art embodiment of FIG. 1A, reference numerals with b-subscript show improvements over corresponding reference numerals with a-subscript.

It is preferable to utilize a very wide-bandgap, optically transparent thin-film layer 104b deposited on the substrate-removed HgCdTe back surface. The wide bandgap thin-film dielectric layer 104b acts as the first (right-most) layer of an AR coating or passivation layer 102b (or alternatively layer stack) designed to minimize reflections from incident radiation and also designed to be impervious to charging from hot electrons generated by the strong backside absorption of short-wavelength visible and UV radiation in the adjacent HgCdTe. The charge-up is prevented by the use of a thin-film layer that has a very wide bandgap and a conduction band (electron) energy that is greater than that of the hot electrons (such as 106b) generated by the absorbed short-wavelength radiation. The wide bandgap thin-film dielectric layer 104b has a bandgap that is greater than 3 electron volts (eV). The wide bandgap thin-film dielectric layer 104b is a thin-film layer having a thickness that is greater than 100 Angstroms and less than 9,000 Angstroms.

Unlike the prior art embodiment shown in FIG. 1A, electron injection is blocked, and photo generated hot electrons (e.g., electron 106b) are reflected at the back interface 126b because they cannot surmount the top of the conduction band in region 114b. Section 128b indicates that there is no comparable negative charging in the wide band layer 104b. Electron injection would therefore be prevented. Region 114b proximal to the back interface 126b does not bend and would remain substantially horizontal and flat similar to the region at the backside N—HgCdTe absorber layer 116b. Holes 108b are not trapped in the potential well. Instead, the holes 108b will diffuse to the right towards P—HgCdTe 118b (the front side of the detector). As such, it is desirable for the wide bandgap thin-film dielectric layer 104b to have a large conduction band offset relative to the backside n-HgCdTe absorber layer 116b, thereby rendering the layer immune to photo-induced hot electron injection from the absorber in the near UV region.

It is preferable to utilize an AR layer that can adhere to the detector without use of an adhesion layer. As such, in a preferred embodiment, the wide bandgap thin-film dielectric layer 104b is an integral part of the AR coating or passivation layer 102b or stack of layers. The adhesion layer is stable even in the presence of environmental humidity and thermal cycling between room temperature and cryogenic temperatures. Furthermore, the preferred embodiment can achieve optical transparency in the near-UV through a wide range of infrared wavelengths, including MWIR (mid-wavelength infrared), LWIR (long-wavelength infrared) and VLWIR (very-long-wavelength infrared).

As set forth above, a very wide-bandgap, thin-film dielectric/passivation layer 104b is deposited on the back surface of a substrate-removed HgCdTe detector or detector array as the first layer of an AR coating or passivation stack 102b. The wide-bandgap thin-film layer 104b has a conduction band that is greater than energy of hot electrons generated by the incident absorbed short-wavelength radiation, thereby preventing electron charging of the layer. The invulnerability of the wide bandgap thin-film layer to electron charge-up prevents the adjacent n-type HgCdTe absorber interface from inverting and subsequently trapping minority carriers photo-generated in this region. By mitigating trapping of minority carriers at the back interface 126b, high collection efficiency at the front side p/n junction is maintained (high detector QE), even with high levels of continuous exposure to short-wavelength near-UV and visible radiation.

Figure 2:
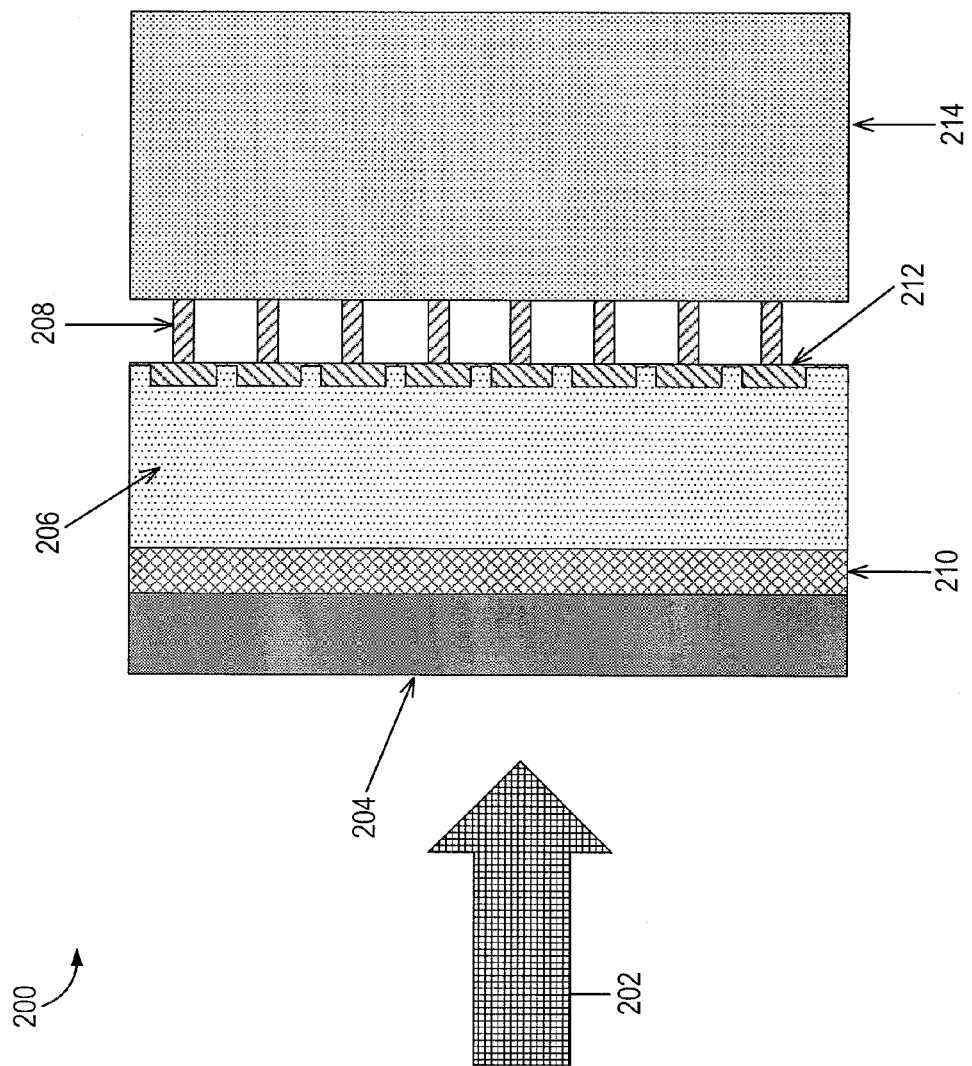
FIG. 2 shows a HgCdTe detector-AR coating assembly according to an embodiment of the present invention.

FIG. 2 shows a HgCdTe detector-AR coating assembly 200 according to an embodiment of the present invention. FIG. 2 is not drawn to scale. Additional AR layers 204 may be utilized proximal to incident near UV visible or IR radiation 202. In other embodiments, as discussed below, the very wide bandgap thin-film layer 210 may be the only AR layer utilized. FIG. 2 shows a p/n HgCdTe diode array 206 (with substrate removed) which may be, for example, 5-10 microns thick. Although p/n diodes are described herein, other types of diodes may be utilized with the AR-coating layer. However, electron charging may not adversely impact n/p detectors since the absorber would be p-type. The removed substrate (not shown) may have been, for example, 800 microns thick. As discussed below with respect to FIG. 3, a substrate is removed, etched on the back side, and subsequently, the very wide bandgap thin-film layer 210 (and optionally, additional AR layers 204) is/are deposited. Pixels of the p/n HgCdTe diode array with removed substrate are attached to the pixels of an ROIC 214 via the indium contacts 208. The ROIC 214 converts the charge to voltage, for example, with an amplifier for each pixel.

Figure 3:
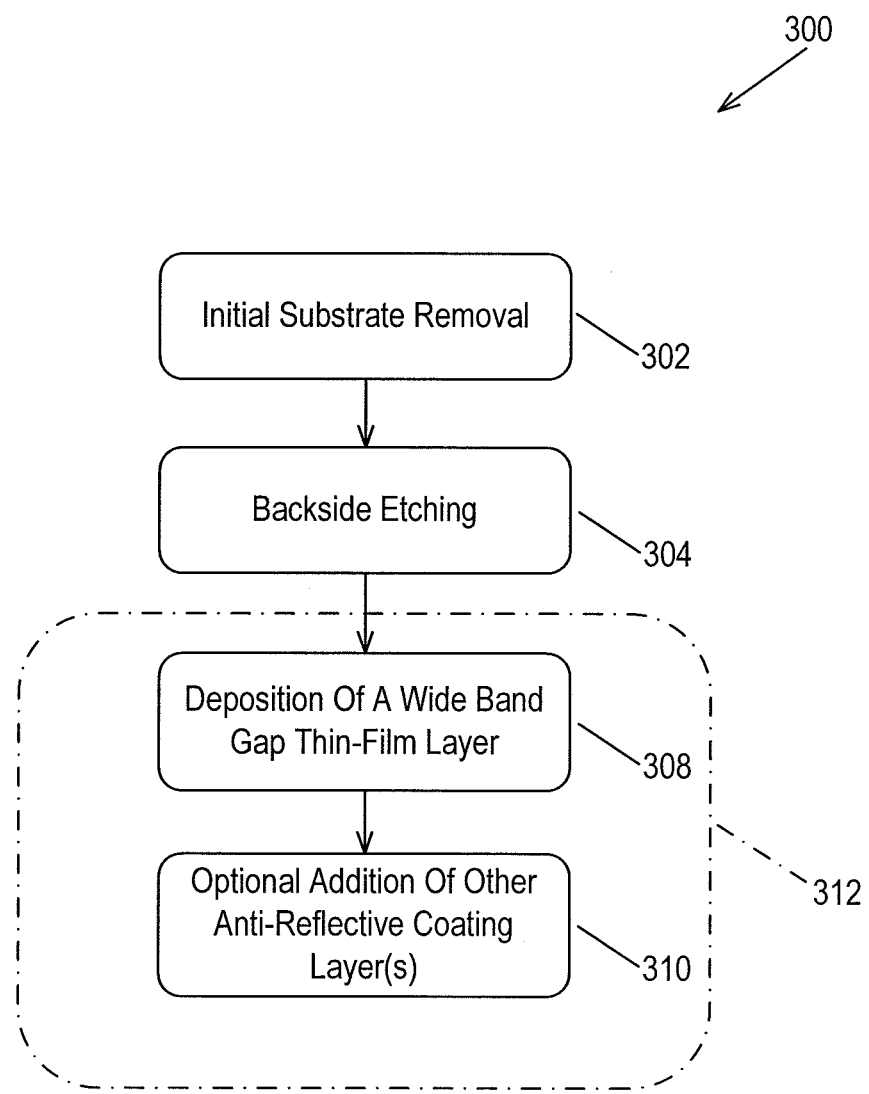
FIG. 3 is a flowchart diagram illustrating a method of manufacturing a substrate-removed, surface passivated, and anti-reflective coated detector assembly according to an embodiment of the present invention.

FIG. 3 is a flowchart diagram illustrating a method 300 of manufacturing a substrate-removed, surface passivated, and anti-reflective coated detector assembly, according to an embodiment of the present invention. In step 302, the substrate is at least partially removed. Because epitaxial HgCdTe is typically grown and processed on substrates that are absorptive for near-IR and visible wavelengths, and because the detector arrays are typically backside illuminated, the substrate is removed for UV-visible detection. For example, the substrate may be about 800 microns thick. The substrate can be polished down to about 30-40 microns. At least a portion of the remaining substrate can be removed using chemical etching. The removal process may be performed until the removal approaches the HgCdTe detector.

In step 304, backside Bromine etching is performed. This removes defects in HgCdTe interface region. In step 308, a wide bandgap thin-film layer is deposited. In a preferred embodiment, Y2O3 (Yttrium oxide) is utilized due to its blue stability and low refractive index. In other embodiments, MgF2 (Magnesium fluoride) and/or CaF2 (Calcium fluoride) are utilized. These three materials can be utilized as a substantially wide bandgap thin-film layer. With short wavelength radiation, hot carriers cannot surmount the conduction band of these materials to charge the layer. These materials can also advantageously adhere to the HgCdTe layer without necessarily incorporating an adhesive layer. These materials advantageously withstand thermo-mechanical cycling without peeling off. Furthermore, these materials act as relatively effective passivation layers for the HgCdTe material. In other words, these materials do not electrically degrade the HgCdTe material, as shown by test results. Other materials having a wide bandgap, favorable adhesive properties, and other similar advantageous characteristics can be utilized as well.

The thickness of the wide bandgap layer may be tens of Angstroms to several hundred Angstroms. In other embodiments, the thickness may be smaller or greater without limiting the scope of the present invention. If the wide bandgap layer is too thin, it will lose its ability to block carriers. On the other hand, thinning the wide bandgap layer is advantageous in that greater flexibility in design of the AR coding layer. By appropriate choice of the wide bandgap layer interfacial optical material, the refractive index permits efficient designs to be implemented for minimum wavelengths including 350 nm and 405 nm. An AR coating or passivation layer may utilize multiple layers of dielectrics. These layers need to be a small fraction of the wavelength of illuminated light. It is preferable for the AR coating layer to closely match the refractive index of HgCdTe to refractive index of air/vacuum. The matching is performed over a range of wavelengths. Since the matching is performed under visible/near UV, the layers are preferable to be much thinner than the wavelength. Therefore, if the wide bandgap layer is too thick, refractive index matching of HgCdTe and air/vacuum under a wide range of wavelengths can be hindered. A thick wide bandgap layer may limit the design options. The layer needs to be sufficiently thin to achieve desirable AR coating properties in conjunction with other layers over a wide range of metal layers.

In certain embodiments, the wide band-gap layer may be utilized in a linear variable AR coating. In such embodiments, the wide band-gap layer can be utilized as the only layer of coating (as opposed to multiple layers in a stack). The wide band-gap layer (e.g., Y2O3) may be deposited non-uniformly over the whole detector array. That is, the thickness of the wide bandgap layer may vary. For example, the thickness may vary along one direction of the array so as to achieve AR coating matching (e.g., quarter-wave matching) at different positions along the array for different incident wavelengths. This can be utilized as a dispersive spectrometer where different wavelengths are incident along different positions of the array.

Step 308 provides further advantages in matching with other subsequent layers for AR coating due to the achieved high refractive index. With this approach, the refractive index and the response of the AR coating can be tuned for different applications.

In step 310, additional AR coating or passivation layer(s) are applied, for example, using electron beam evaporation processing (e-beam or e-beam-2). Yet another advantage of the method 300 is that final surface preparation and wide bandgap thin-film layer deposition in step 308 as well as subsequent AR coating or passivation deposition in step 310 can be performed in a single vacuum chamber, as indicated by the dashed block 312. This enhances producibility, cleanliness, yield, and throughput.

One problem with other processes performed in multiple chambers is that they require multiple process tools as well as close-coupling between the tools to prevent oxide formation, which degrades performance. The oxide formation is deleterious in that it reduces the stability of devices under blue illumination. The complexity of utilizing multiple chambers and tools may cause production compatibility and reproducibility issues. Furthermore, utilizing multiple chambers may reduce QE.

According to the preferred embodiment set forth above in method 300, by performing the steps in the same vacuum chamber as indicated by dashed block 312, close coupling may not be required. The AR or passivation layer coating can be performed using less sophisticated or conventional AR deposition methods without special equipment because the chamber is an AR coating chamber. As a result, sputtering the coating with different types of sources or different types of chambers are not required because the process is compatible with various coating methods. Therefore, the need for close coupling is eliminated, scheduling demands are reduced, and shorter cycle time is achieved. Furthermore, utilizing the single chamber is advantageous in that the process is compatible with additional optical layers required to complete the AR or passivation coating stack.

Although the preferred embodiment includes performing the steps in a single chamber providing unique advantages set forth above, in alternative embodiments, one or more of the steps may be performed in multiple vacuum chambers based on design concerns.

Furthermore, the method 300 is stable with respect to bake-out. The detector may be baked and heated to remove residuals (e.g., residual gases) as part of the manufacturing/formation process. The detector having the integrated wide bandgap thin-film layer described herein is stable in presence of baking and applied heat.

Other advantages of utilizing the dielectric materials listed above include enhanced robustness against degradation as a result of illumination in part due to the wide bandgap thin-film layer. Furthermore, refractive indices that are more amenable to use as part of an AR coating assembly can be utilized. In addition, the wide bandgap thin-film layer has no adverse impact on detector dark current or noise.

Exemplary implementations have been disclosed in an illustrative manner. Accordingly, the terminology employed throughout should be read in a non-limiting manner Although minor modifications to the teachings herein will occur to those well versed in the art, it shall be understood that what is intended to be circumscribed within the scope of the patent warranted hereon are all such implementations that reasonably fall within the scope of the advancement to the art hereby contributed, and that that scope shall not be restricted, except in light of the appended claims and their equivalents.

The invention claimed is:

1. A method of manufacturing a substrate-removed, surface passivated, and anti-reflective coated detector assembly, the method comprising:
   providing a substrate-detector assembly having an imaging detector connected to a substrate;
   removing a part of the substrate to obtain a partially-removed-substrate detector assembly;
   etching a backside of the partially-removed-substrate detector assembly to obtain an imaging detector assembly removed from the substrate;
   depositing, in a vacuum chamber, a wide bandgap layer on the imaging detector assembly; and
   depositing, in the vacuum chamber, an anti-reflective or passivation coating layer on the wide bandgap layer such that the wide bandgap layer is integrated with the anti-reflective or passivation coating layer and positioned proximal to an interface portion between the anti-reflective or passivation coating layer and the imaging detector assembly.

2. The method of claim 1, wherein the deposited wide bandgap layer is made of at least one of Y2O3 (Yttrium oxide), MgF2 (Magnesium fluoride) or CaF2 (Calcium fluoride).

3. The method of claim 1, wherein the wide bandgap layer is a thin-film layer that serves as a passivation layer and has a thickness that is greater than 100 Angstroms and less than 9,000 Angstroms.

4. The method of claim 1, wherein the wide bandgap layer is made of a transparent material and has a bandgap that is greater than 3 electron volts (eV).

5. The method of claim 1, wherein the step of depositing, in the vacuum chamber, the anti-reflective coating layer on the wide bandgap layer matches a refractive index of the imaging detector to a refractive index of vacuum.

6. The method of claim 1, wherein the anti-reflective or passivation coating layer includes a stack of anti-reflective or passivation coating sublayers integrated with the wide bandgap thin-film layer.

7. The method of claim 1, wherein the substrate is made of CdZnTe (Cadmium zinc telluride), and the imaging detector is a photodiode made of at least one of HgCdTe (mercury cadmium telluride), III-V arsenides or antimonides.

8. The method of claim 1, wherein the step of removing a part of the substrate to obtain the partially-removed-substrate detector assembly is performed using chemical etching until a partially removed substrate portion has a thickness between 30-40 microns.

9. The method of claim 1, wherein the step of depositing, in the vacuum chamber, the anti-reflective or passivation coating layer on the wide bandgap layer is performed using electron beam evaporation.

10. The method of claim 1, further comprising baking or heating the imaging detector assembly to remove residuals.

11. The method of claim 1, wherein the step of depositing, in the vacuum chamber, the anti-reflective or passivation coating layer of the wide bandgap layer does not utilize an adhesive layer.

* * * * *